(12) United States Patent
Hwang

(10) Patent No.: US 9,293,518 B2
(45) Date of Patent: Mar. 22, 2016

(54) THIN FILM TRANSISTOR, AND ORGANIC LIGHT-EMITTING DISPLAY DEVICE THEREWITH

(71) Applicant: Jae-Kwon Hwang, Yongin (KR)

(72) Inventor: Jae-Kwon Hwang, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 129 days.

(21) Appl. No.: 13/799,241

(22) Filed: Mar. 13, 2013

(65) Prior Publication Data

US 2014/0124746 A1 May 8, 2014

(30) Foreign Application Priority Data

Nov. 8, 2012 (KR) ........................ 10-2012-0126162

(51) Int. Cl.
H01L 51/50 (2006.01)
H01L 27/32 (2006.01)
H01L 29/423 (2006.01)
H01L 29/49 (2006.01)
H01L 29/786 (2006.01)
H01L 51/52 (2006.01)

(52) U.S. Cl.
CPC ...... H01L 27/3279 (2013.01); H01L 29/42384 (2013.01); H01L 29/4908 (2013.01); H01L 29/7869 (2013.01); H01L 51/5209 (2013.01); H01L 51/5225 (2013.01); H01L 27/3244 (2013.01)

(58) Field of Classification Search
CPC ............ H01L 51/0021; H01L 51/0037; H01L 51/5203; H05B 33/10
USPC .............. 257/40, E51.007, E51.049; 359/254
See application file for complete search history.

(56) References Cited

U.S. PATENT DOCUMENTS

| 2005/0151195 | A1* | 7/2005  | Kawase et al. ................. 257/347 |
| 2007/0176202 | A1* | 8/2007  | Inoue et al. .................... 257/192 |
| 2011/0013127 | A1* | 1/2011  | Takahashi ...................... 349/112 |
| 2011/0163979 | A1* | 7/2011  | Kim et al. ...................... 345/173 |
| 2011/0260159 | A1* | 10/2011 | Yamazaki et al. .............. 257/43  |
| 2012/0019476 | A1  | 1/2012  | Kim et al.                            |
| 2012/0046472 | A1* | 2/2012  | Park et al. ..................... 548/145 |
| 2012/0142132 | A1* | 6/2012  | Adachi .......................... 438/34  |

FOREIGN PATENT DOCUMENTS

| JP | 2010-076044 A    | 4/2010  |
| KR | 10-2009-0113487 A | 11/2009 |
| KR | 10-2012-0010485 A | 2/2012  |

OTHER PUBLICATIONS

"AMOLED display market tops $3BN in 2011", Market News at Optics.Org (Jan. 6, 2012).*

* cited by examiner

Primary Examiner — Thomas L Dickey
(74) Attorney, Agent, or Firm — Lee & Morse, P.C.

(57) ABSTRACT

A thin film transistor includes a gate electrode on a substrate, the gate electrode including a wire grid pattern, an active layer on the substrate, a gate insulating film between the gate electrode and the active layer, and a source electrode and a drain electrode connected to the active layer.

18 Claims, 8 Drawing Sheets

THIN FILM TRANSISTOR, AND ORGANIC LIGHT-EMITTING DISPLAY DEVICE THEREWITH

CROSS-REFERENCE TO RELATED PATENT APPLICATION

This application claims the benefit of Korean Patent Application No. 10-2012-0126162, filed on Nov. 8, 2012, in the Korean Intellectual Property Office, the disclosure of which is incorporated herein in its entirety by reference.

BACKGROUND

1. Field of the Invention

Example embodiments relate to thin film transistors (TFTs), and more particularly, to organic light-emitting display devices including the same.

2. Description of the Related Art

For a high-resolution display, a flat panel display apparatus, e.g., a liquid crystal display (LCD) device and the like, is formed on an active matrix backplane. For example, a thin film transistor (TFT), a capacitor, and the like may be included in each pixel in of the active matrix backplane. For example, an oxide semiconductor TFT has improved device characteristics and may be formed at low temperatures, thereby being an advantageous element for the backplane of the flat panel display.

SUMMARY

Example embodiments provide a thin film transistor having high conductivity and transparency and an organic light-emitting display device including the same.

According to an aspect of the example embodiments, there is provided a thin film transistor including a gate electrode on the substrate, the gate electrode including a wire grid pattern, an active layer on the substrate, a gate insulating film between the gate electrode and the active layer, and a source electrode and a drain electrode connected to the active layer.

The gate electrode may include a conductive polymer.

The conductive polymer may include at least one of PEDOT-PSS, polythiophene, poly(3-alkylthiophene), polypyrrole(PPY), poly((2,5 dialkoxy)-p-phenylene vinylene), polyp-phenylene vinylene), and poly(p-phenylene).

The wire grid pattern of the gate electrode may extend in a same direction as that of a crystal growth.

The wire grid pattern may have a critical dimension of about 10 nm to about 100 nm.

A width of projections in the wire grid pattern may be about 10 nm to about 100 nm.

Each of the source electrode and the drain electrode may include a wire grid pattern.

The gate electrode, the gate insulating film, and the active layer may be stacked on the substrate in the stated order.

The active layer, the gate insulating film, and the gate electrode may be stacked on the substrate in the stated order, the source and rain electrodes penetrating through the gate insulating film to connect to the active layer.

Each of the source electrode and the drain electrode may include a conductive polymer shaped as a wire grid pattern, the wire grid pattern extending in a same direction as that of a crystal growth.

The wire grid pattern of the gate electrode may extend in a direction in which a crystal is grown and may include a conductive polymer, the conductive polymer being at least one of PEDOT-PSS, polythiophene, poly(3-alkylthiophene), polypyrrole(PPY), poly((2,5 dialkoxy)-p-phenylene vinylene), poly(p-phenylene vinylene), and poly(p-phenylene).

According to an aspect of the example embodiments, there is provided an organic light-emitting display device including a substrate, a thin film transistor on the substrate, a first electrode layer contacting the thin film transistor, the first electrode layer including a wire grid pattern, an organic emission layer on the first electrode layer, and a second electrode layer on the organic emission layer.

The first electrode layer may include a conductive polymer.

The conductive polymer may include at least one material of PEDOT-PSS, polythiophene, poly(3-alkylthiophene), polypyrrole(PPY), poly((2,5 dialkoxy)-p-phenylene vinylene), poly(p-phenylene vinylene), and poly(p-phenylene).

The wire grid pattern of the first electrode layer may extend in a same direction as that of a crystal growth.

The second electrode layer may include metal having a low work function.

The wire grid pattern of the first electrode layer may have a critical dimension of about 10 nm to about 100 nm.

BRIEF DESCRIPTION OF THE DRAWINGS

The above and other features and advantages will become more apparent by describing in detail exemplary embodiments with reference to the attached drawings, in which.

DETAILED DESCRIPTION

Figure 1:
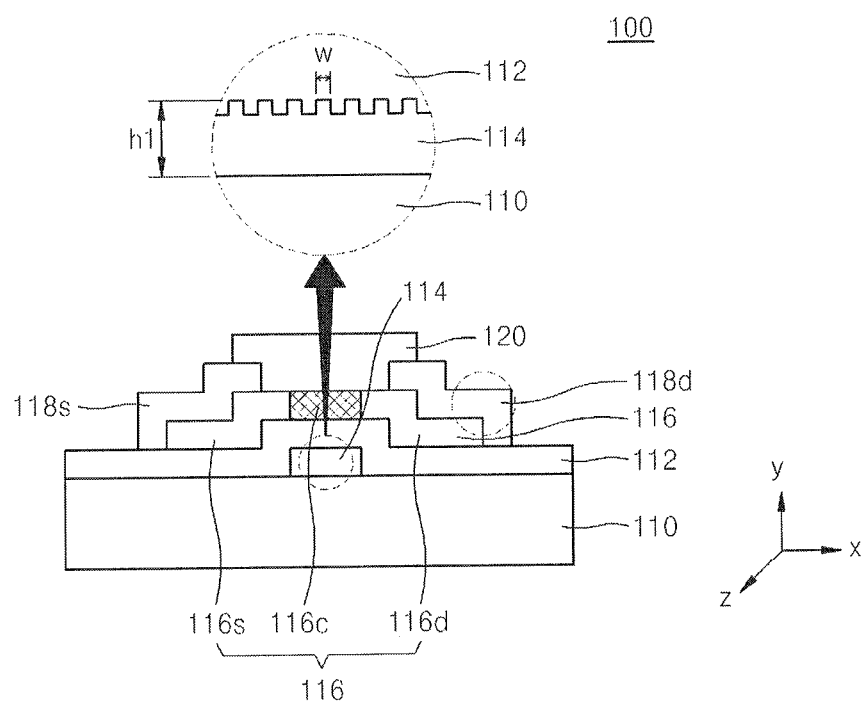
FIG. 1 is a schematic cross-sectional view of a thin film transistor (TFT) according to an embodiment.

Hereinafter, example embodiments will be described more fully with reference to the accompanying drawings. The example embodiments may, however, be embodied in many different forms and should not be construed as limited to the embodiments set forth herein, so the exemplary embodiments may cover all modifications, equivalents, and alternatives falling within the scope of the inventive concept.

In the following description, well-known functions or constructions are not described in detail if it is determined that they would obscure the example embodiments due to unnecessary detail. It will be understood that, although the terms 'first', 'second', 'third', etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

The terminology used herein is for the purpose of describing particular embodiments only and is not intended to be limiting of the invention. As used herein, the singular forms 'a', 'an' and 'the' are intended to include the plural forms as well, unless the context clearly indicates otherwise. It will be further understood that the terms 'comprise' and 'include' when used in this specification, specify the presence of stated features, integers, steps, operations, elements, and/or components, but do not preclude the presence or addition of one or more other features, integers, steps, operations, elements, components, and/or groups thereof. Also, '/' used herein may be understood as 'and' or 'or' according to context.

In the drawings, the dimensions of layers and regions may be exaggerated for clarity. The same reference numerals represent the same elements throughout the drawings. It will also be understood that when an element or layer is referred to as being "on" another element or layer, the element or layer can be directly on another element or layer or intervening elements or layers. In contrast, when an element is referred to as being "directly on" another element or layer, there are no intervening elements or layers present.

Expressions such as "at least one of," when preceding a list of elements, modify the entire list of elements and do not modify the individual elements of the list.

FIG. 1 is a schematic cross-sectional view of a thin film transistor (TFT) 100 according to an embodiment. Referring to FIG. 1, the TFT 100 may include a gate electrode 114, an active layer 116, a source electrode 118s, and a drain electrode 118d formed on a substrate 110.

A first insulating layer 112, i.e., a gate insulating film, is disposed between the gate electrode 114 and the active layer 116 to insulate the gate electrode 114 and the active layer 116 from each other. A source region 116s and a drain region 116d that are doped with high-concentration impurities are formed at both edges of the active layer 116 while having a channel region 116c therebetween, and are electrically connected to the source electrode 118s and the drain electrode 118d, respectively.

The substrate 110 may be a transparent insulating substrate formed of glass, quartz, ceramic, plastic, or the like.

The gate electrode 114 may include a wire grid pattern, as illustrated in the enlarged portion illustrated in FIG. 1. The wire grid pattern of the gate electrode 114 may include a plurality of alternating projections and indentation, i.e., a plurality of projections at constant intervals, so a width "w" of one projection may define a critical dimension of the wire grid pattern. For example, the critical dimension of the wire grid pattern may be about 10 nm to about 100 nm.

The wire grid pattern of the gate electrode 114 may extend in a first direction, e.g., along the z-axis. That is, the longitudinal direction of the projections in the wire grid pattern may extend along the first direction. The direction of the wire grid pattern, i.e., the first direction, may be the same as that of a crystal growth in the gate electrode 114, thereby securing high conductivity and transparency of the gate electrode 114.

The gate electrode 114 having the wire grid pattern may be formed of a conductive polymer. The conductive polymer may include, but is not limited to, at least one of PEDOT-PSS, polythiophene, poly(3-alkylthiophene), polypyrrole (PPY), poly((2,5 dialkoxy)-p-phenylene vinylene), poly(p-phenylene vinylene), and poly(p-phenylene). The gate electrode 114 may be formed using, e.g., nano-imprinting, capillary force lithography (CFL), or nano transfer molding, but is not limited thereto.

Properties, e.g., conductivity, of the gate electrode 114 with a nano wire grid pattern are compared to properties of a conventional gate electrode, i.e., a thin film structure without a wire grid pattern, in Table 1 below.

TABLE 1

| | Gate Electrode with a Thin Film Structure | Gate Electrode with a Nano Wire Grid Pattern |
|---|---|---|
| Thickness (nm) | 180 | 120 |
| Correction factor (CF) | 4.532 | 1 |
| Specific resistance (Ω/cm) | 0.002979 | 0.00012245 |
| Conductivity (S · cm) | 355.68 | 8166.67 |

Referring to Table 1 above, the gate electrode 114 according to example embodiments has a specific resistance of 0.002979 (Ω/cm) and a conductivity of 335.68 (S·cm), while being formed in a wire grid pattern having a nano-scale width w and a thickness, i.e., height hl, of 120 nm. The conventional gate electrode, i.e., the thin film structure without the wire grid pattern, has a thickness of 180 nm, a specific resistance of 0.00012245 (Ω/cm), and a conductivity of 8166.67 (S·cm). Thus, the conductivity of the gate electrode 114 according to an example embodiment is at least twenty-four (24) times higher than that of the conventional gate electrode. Also, since metal particles or carbon nano tubes do not need to be mixed to improve the conductivity of the gate electrode 114, the transparency of the gate electrode 114 may also be prevented from being reduced.

The active layer 116 of the TFT 100 is formed on the first insulating layer 112, i.e., a gate insulating film, that covers the gate electrode 114. The active layer 116 may include a semiconductor material, e.g., amorphous silicon or polysilicon, or a transparent conductive oxide, e.g., at last one of zinc (Zn), gallium (Ga), hafnium (Hf), indium (In), and tin (Sn). For example, the transparent conductive oxide in the active layer 116 may be InGaZnO, ZnSnO, InZnO, InGaO, ZnO, TiO, and/or hafnium-indium-zinc oxide (HIZO). An oxide semiconductor TFT including a transparent conductive oxide as the active layer 116 exhibits improved device characteristics and may be formed at low temperatures, thereby being considered as an optimal element for a backplane of a flat panel display. Furthermore, the oxide semiconductor TFT not only has transparent characteristics in a visible-light region but also is flexible, thereby facilitating implementation in a transparent display device or a flexible display device.

The source electrode 118s and the drain electrode 118d are formed on the source region 116s and the drain region 116d of the active layer 116 to be connected to the source region 116s and the drain region 116d, respectively. A protective layer 120 is formed on the active layer 116.

The source electrode 118s and the drain electrode 118d may each have a wire grid pattern that may have a critical dimension of about 10 nm to about 100 nm. Since the source electrode 118s and the drain electrode 118d may each have a wire grid pattern extending in a direction in which a crystal is grown, e.g., the z-axis direction, high conductivities and transparencies of the source electrode 118s and the drain electrode 118d may be secured.

The source electrode 118s and the drain electrode 118d may be each formed using a conductive polymer. The conductive polymer may include, but is not limited to, at least one of PEDOT-PSS, polythiophene, poly(3-alkylthiophene), polypyrrole(PPY), poly((2,5 dialkoxy)-p-phenylene vinylene), poly(p-phenylene vinylene), and poly(p-phenylene). The source electrode 118s and the drain electrode 118d may be formed using, e.g., nano transfer molding, but is not limited thereto.

Figure 2:
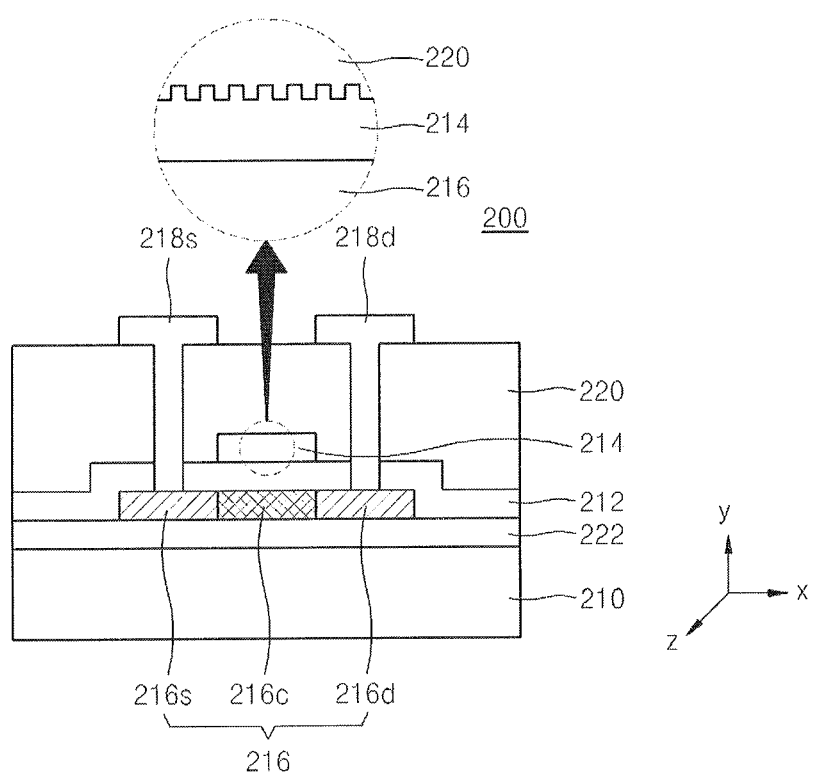
FIG. 2 is a schematic cross-sectional view of a TFT according to another embodiment.

FIG. 2 is a schematic cross-sectional view of a TFT 200 according to another embodiment.

Referring to FIG. 2, the TFT 200 includes a substrate 210, an active layer 216 formed on the substrate 210, a gate insulating film 212 formed on the active layer 216, a gate electrode 214 disposed to be insulated from the active layer 216, and a source electrode 218s and a drain electrode 218d formed to pass through an insulating layer 220 and the gate insulating film 212 to be electrically connected to the active layer 216. The TFT 200 may further include an auxiliary layer 222 on the substrate 210.

The active layer 216 may include a semiconductor material, e.g., amorphous silicon or polysilicon, or a transparent conductive oxide, e.g., at least one of zinc (Zn), gallium (Ga), hafnium (Hf), indium (In), and tin (Sn). For example, the transparent conductive oxide may be InGaZnO, ZnSnO, InZnO, InGaO, ZnO, TiO, and/or hafnium-indium-zinc oxide (HIZO).

The gate electrode 214 may have a wire grid pattern that may have a critical dimension of about 10 nm to about 100 nm. The gate electrode 214 may include a wire grid pattern extending in a direction in which a crystal is grown (z-axis direction), thereby securing high conductivity and transparency of the gate electrode 214.

The gate electrode 214 having the wire grid pattern may be formed of a conductive polymer. The conductive polymer may include, but is not limited to, at least one of PEDOT-PSS, polythiophene, poly(3-alkylthiophene), polypyrrole(PPY), Poly((2,5 dialkoxy)-p-phenylene vinylene), poly(p-phenylene vinylene), and poly(p-phenylene). The gate electrode 214 may be formed, e.g., using nano-imprinting, capillary force lithography (CFL), or nano transfer molding, but is not limited thereto.

As discussed previously with reference to FIG. 1, the conductivity of the gate electrode 214 according to an embodiment is at least twenty four (24) times higher than that of a conventional gate electrode (see Table 1). Thus, since metal particles or carbon nano tubes are not required to improve the conductivity of the gate electrode 214 (due to the already high conductivity), high transparency of the gate electrode 214 may be maintained. In contrast, the transparency of a conventional transparent electrode may be lowered during mixing of metal particles or carbon nano tubes to improve conductivity.

Although FIG. 1 illustrates a bottom gate type TFT, i.e., TFT 100, and FIG. 2 illustrates a top gate type TFT, i.e., TFT 200, an electrode having a wire grid pattern according to an embodiment is not limited thereto and may be applied to various types of TFTs.

Figure 3:
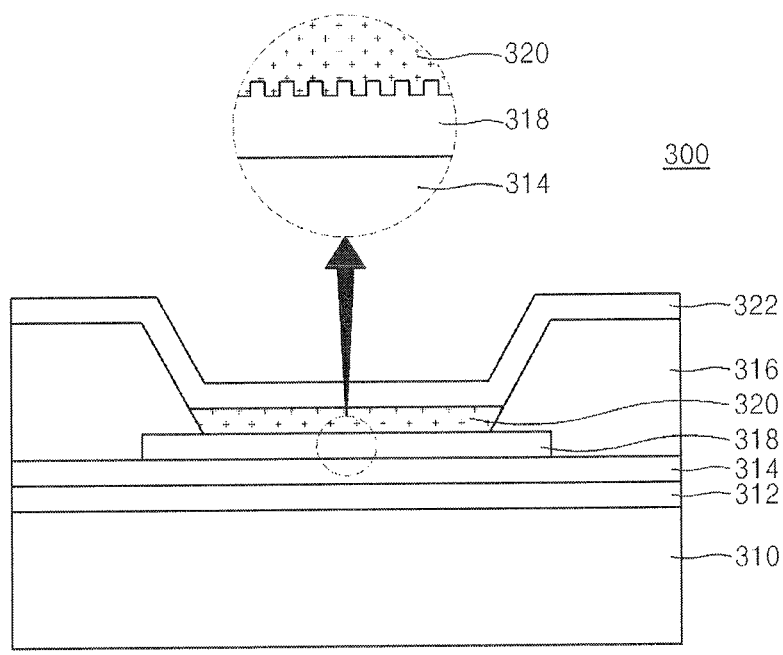
FIG. 3 is a schematic cross-sectional view of a pixel region of an organic light-emitting display device according to an embodiment.

FIG. 3 is a schematic cross-sectional view of a pixel region 300 of an organic light-emitting display device according to an embodiment.

Referring to FIG. 3, in the pixel region 300, an auxiliary layer 312 and a first insulating layer 314 are sequentially formed on a substrate 310, and a first electrode layer 318 is formed directly on the first insulating layer 314. The first electrode layer 318 contacts a TFT (not shown) formed on the substrate 310.

The first electrode layer 318 may include a wire grid pattern that may have a critical dimension of about 10 nm to about 100 nm. The first electrode layer 318 may have a wire grid pattern extending in a direction in which a crystal is grown (z-axis direction). The first electrode layer 318 having the wire grid pattern may be formed of a conductive polymer, e.g., at least one of PEDOT-PSS, polythiophene, poly(3-alkylthiophene), polypyrrole(PPY), poly((2,5 dialkoxy)-p-phenylene vinylene), poly(p-phenylene vinylene), and poly(p-phenylene). The first electrode layer 318 may be formed, e.g., using nano-imprinting, capillary force lithography (CFL), or nano transfer molding, but is not limited thereto. The first electrode layer 318 may be electrically connected to one of the source electrode 118s (or 218s) and the drain electrode 118d (or 218d) of the TFT 100 (or 200) described above with reference to FIG. 1 or FIG. 2.

In the pixel region 300, a second electrode layer 322 is disposed opposite to the first electrode layer 318, and an organic emission layer 320 is disposed between the first and second electrode layers 318 and 322. The second electrode layer 322 may be formed by thinly depositing metal having a low work function, e.g., Ag, Mg, Al, Pt, Pd, Au, Ni, Nd, Ir, Cr, Li, Ca, LiF/Ca, LiF/Al, or a combination thereof.

The first electrode layer 318 may be a pixel electrode of an organic emission element EL having optical transmission properties. The second electrode layer 322 may be formed as an optical reflective electrode which is an opposite electrode of the organic emission element EL. In this case, the organic light-emitting display device is a bottom emission type that emits light toward a bottom surface of the substrate 310.

In contrast, when the second electrode layer 322 is a pixel electrode of an organic emission element EL having optical transmission properties and the first electrode layer 318 is formed as an optical reflective electrode which is an opposite electrode of the organic emission element EL, the organic light-emitting display device may be a top emissive type that emits light toward a front surface of the substrate 310. In this case, the first electrode layer 318 may be formed by thinly depositing metal having a low work function, e.g., Ag, Mg, Al, Pt, Pd, Au, Ni, Nd, Ir, Cr, Li, Ca, LiF/Ca, LiF/Al, or a combination thereof.

Also, the second electrode layer 322 may be formed using a conductive polymer to have a wire grid pattern. The second electrode layer 322 may be formed using nano transfer molding but is not limited thereto.

The organic emission layer 320 may include a low molecular weight organic material or a high molecular weight organic material. When the organic emission layer 320 includes a low molecular weight organic material, the organic emission layer 320 may further include a hole transportation layer and a hole injection layer around the low molecular weight organic material in a direction of the first electrode layer 318, and may further include an electron transportation layer and an electron injection layer in a direction of the second electrode layer 322. In addition, the organic emission layer 320 may further include any other layers if needed. When the organic emission layer 320 includes the high molecular weight organic material, the organic emission layer 320 may further include only a hole transportation layer in a direction of the first electrode layer 318.

FIGS. 4 to 8 are schematic diagrams illustrating a method of forming an electrode having a wire grid pattern according to an embodiment.

Figure 4:
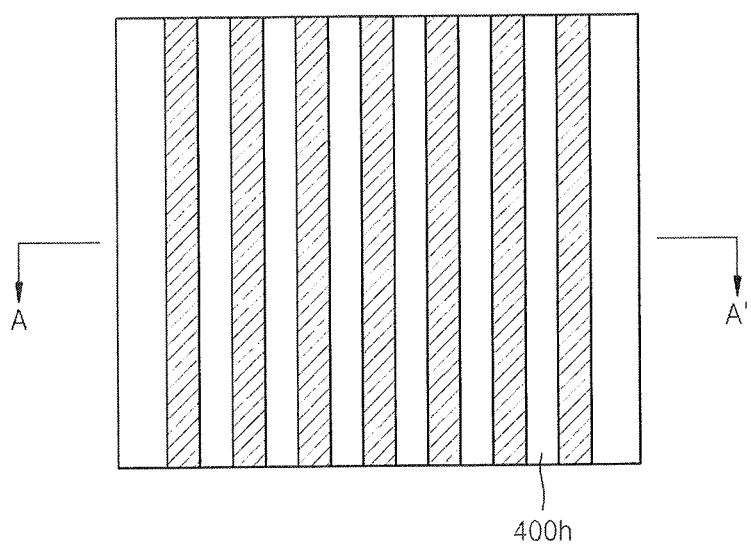
FIGS. 4 to 8 are schematic diagrams illustrating a method of forming an electrode having a wire grid pattern according to an embodiment.
Figure 5:
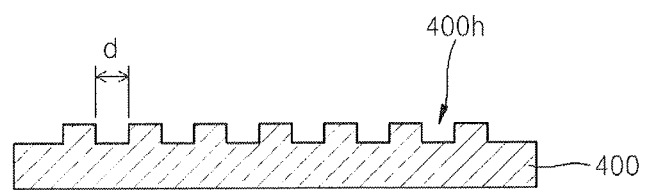

FIG. 4 is a schematic plan view of a stamp 400 for forming a wire grid pattern according to an embodiment. FIG. 5 is a cross-sectional view along line A-A' of FIG. 4.

Referring to FIGS. 4 and 5, the stamp 400 having a stripe pattern in which a plurality of grooves 400h are formed at predetermined intervals is prepared. The plurality of grooves 400h in the stamp 400 may each have a critical dimension d of about 100 nm or less. The stamp 400 having the stripe pattern may be formed using, e.g., laser interference lithography, e-beam lithography, or nano imprint lithography. Any suitable process of forming the stamp 400 may be used.

The stamp 400 may be formed of polymer or metal. However, if the stamp 400 is formed of metal, and as metal exhibits high conductivity and heat transfer, heat may be more smoothly transferred to a wire grid 510 (FIG. 8) when the wire grid 510 is hardened using thermal energy, thereby increasing the speed of hardening the wire grid 510.

Figure 6:

Referring to FIG. 6, a conductive polymer layer 510' is formed by spin-coating a conductive polymer on a substrate 500. The substrate 500 may be, e.g., a low-temperature polysilicon (LTPS) substrate having optical transmission properties, a glass substrate, or a plastic substrate, but is not limited thereto. The conductive polymer layer 510' may include, e.g., at least one of PEDOT-PSS, polythiophene, poly(3-alkylthiophene), polypyrrole(PPY), poly((2,5 dialkoxy)-p-phenylene vinylene), poly(p-phenylene vinylene), and poly(p-phenylene), but is not limited thereto.

Figure 7:
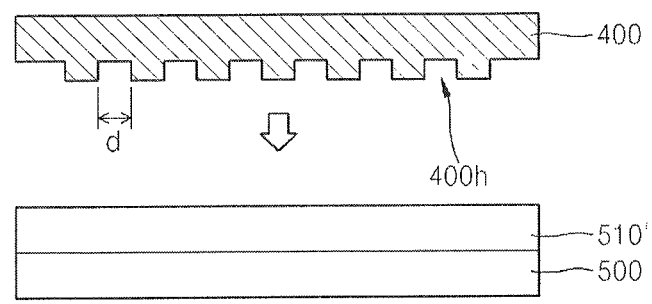
Figure 8:
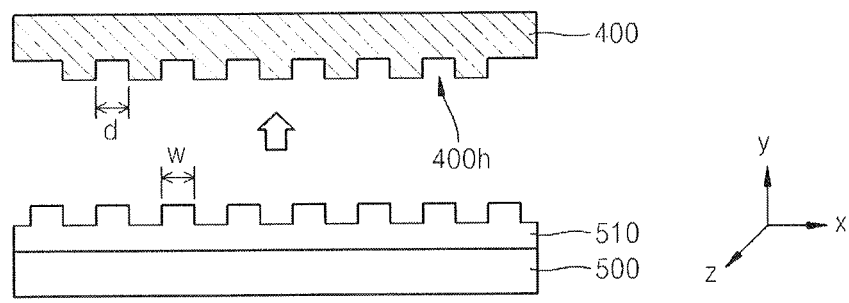

Next, referring to FIGS. 7 and 8, the stamp 400 having the stripe pattern with the grooves 400h is arranged on the conductive polymer layer 510'. Next, the stamp 400 is pressed against the conductive polymer layer 510' to transfer the stripe pattern to the conductive polymer layer 510', followed by removal of the stamp 400.

Then, an electrode 510 having the stripe pattern may be formed from the conductive polymer layer 510'. The electrode 510 may be hardened by irradiating an ultraviolet (UV) light or thermal energy on the electrode 510, while the stamp 400 is pressed into the conductive polymer layer 510'. Otherwise, after the stamp 400 is detached from the conductive polymer layer 510', the electrode 510 may be hardened by irradiating UV light or thermal energy onto the electrode 510.

Since the stamp 400 has the stripe pattern having grooves with a critical dimension "d" extending in one direction, the electrode 510 may be formed with a wire grid extending in a same direction in which a crystal is grown (z-axis direction), thereby securing high conductivity and transparency of the electrode 510. The electrode 510 may be formed to have projections with a width w of about 10 nm to about 100 nm that correspond to the grooves of the stamp 400. The narrower the width w is, the higher the conductivity of the electrode 510 is.

Although the electrode 510 has been described as being formed using nano-imprinting, the example embodiments is not limited thereto and the electrode 510 may be formed using capillary force lithography (CFL) or nano transfer molding according to a shape of the electrode 510.

FIGS. 9 to 15 are cross-sectional views illustrating a method of forming an organic light-emitting display device according to an embodiment.

Figure 9:
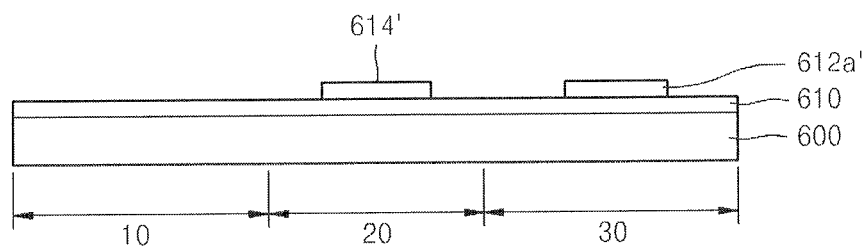
FIGS. 9 to 15 are cross-sectional views illustrating a method of forming an organic light-emitting display device according to an embodiment.

Referring to FIG. 9, an auxiliary layer 610 is formed on a substrate 600. The substrate 600 may be, e.g., a low-temperature polysilicon (LTPS) substrate having optical transmission properties, a glass substrate, or a plastic substrate but is not limited thereto.

The auxiliary layer 610 may include a barrier layer, a blocking layer, and/or a barrier layer to prevent impurities, e.g., ions, from being diffused into the substrate 600, protect the substrate 600 against moisture or external air, and planarize a surface of the substrate 600. The auxiliary layer 610 may be formed of $SiO_2$ and/or $SiN_x$ according to any suitable deposition method, e.g., plasma enhanced chemical vapor deposition (PECVD), atmospheric pressure CVD (APCVD), and low pressure CVD (LPCVD).

Next, a semiconductor layer (not shown) is formed on the auxiliary layer 610. Next, an active region 614' is formed in a TFT area 20 by patterning the semiconductor layer, and a masking process is performed in a storage area 30 to form a capacitor lower electrode region 612a'. The masking process according to an embodiment is described below.

First, an amorphous silicon layer (not shown) is deposited on the auxiliary layer 610, and is then crystallized into a polycrystalline silicon layer (not shown). The amorphous silicon may be crystallized according to any suitable method, e.g., rapid thermal annealing (RTA), solid-phase crystallization (SPC), excimer laser annealing (ELA), metal induced crystallization (MIC), metal induced lateral crystallization (MILC), and sequential lateral solidification (SLS).

Figure 11:
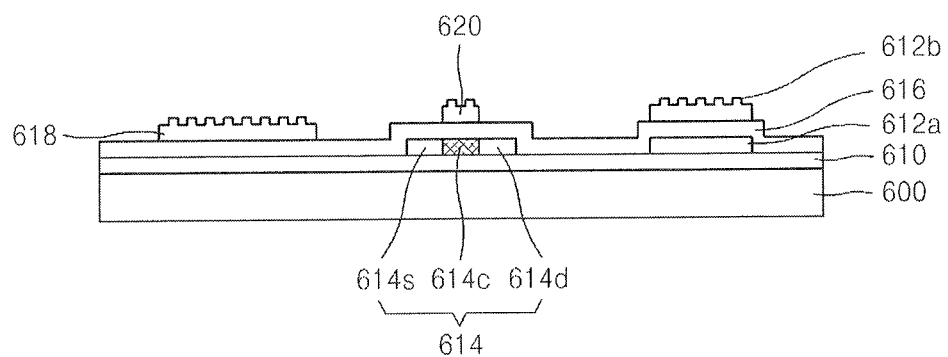

The polycrystalline silicon layer is patterned into the active region 614' and the capacitor lower electrode region 612a' according to the masking process. The active region 614' and the capacitor lower electrode region 612a' are doped with impurities to become an active layer 614 and a capacitor lower electrode 612a, as illustrated in FIG. 11.

Figure 10:
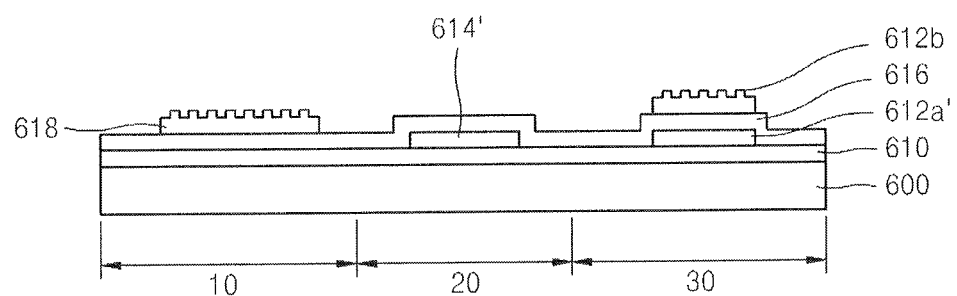

Referring to FIG. 10, a first insulating film 616 is formed on a front surface of the substrate 600, on which the active region 614' and the capacitor lower electrode region 612a' are formed. The first insulating layer 616 may be formed on the front surface of the substrate 600 using an inorganic insulating film, e.g., $SiN_x$ or $SiO_x$, according to PECVD, APCVD, or LPCVD. The first insulating layer 616 is present between the active layer 614 and a gate electrode 620, as illustrated in FIG. 11, to act as a gate insulating film of the TFT, and is present between a capacitor upper electrode 612b and the capacitor lower electrode 612a, which will be described below, to act as a dielectric layer of a capacitor Cst.

Then, a first electrode layer 618, which is a pixel electrode, is formed in a pixel area 10 and the capacitor upper electrode 612b is formed in the storage area 30. The first electrode layer 618 may be formed using a conductive polymer having a wire grid pattern. The first electrode layer 618 may be formed according to nano transfer molding but is not limited thereto. The conductive polymer may be, but is not limited to, at least one material of PEDOT-PSS, polythiophene, poly(3-alkylthiophene), polypyrrole(PPY), poly((2,5 dialkoxy)-p-phenylene vinylene), poly(p-phenylene vinylene), and poly(p-phenylene).

The capacitor upper electrode 612b may be formed of a conductive polymer having a wire grid pattern. Also, the capacitor upper electrode 612b may be formed using nano transfer molding but is not limited thereto. The conductive polymer may be, but is not limited to, at least one material of PEDOT-PSS, polythiophene, poly(3-alkylthiophene), polypyrrole(PPY), poly((2,5 dialkoxy)-p-phenylene vinylene), poly(p-phenylene vinylene), and poly(p-phenylene).

Referring to FIG. 11, a gate electrode 620 is formed on the active region 614' of the TFT. The gate electrode 620 may be formed of a conductive polymer having a wire grid pattern. Also, the gate electrode 620 may be formed using nano transfer molding but is not limited thereto. The conductive polymer may be, but is not limited to, at least one material of PEDOT-PSS, polythiophene, poly(3-alkylthiophene), polypyrrole(PPY), poly((2,5 dialkoxy)-p-phenylene vinylene), poly(p-phenylene vinylene), and poly(p-phenylene).

Then, a doping process is performed on the active region 614' and the capacitor lower electrode region 612a'. The active region 614' is doped with n or p type impurities using the gate electrode 620 as a self-align mask so that portions of the active region 614' corresponding to both sides of the gate electrode 620 formed to correspond to a center of the active region 614' may become a source region 614s and a drain region 614d, respectively. Thus, the active layer 614 is formed having the source region 614s, the drain region 614d, and a channel region 614c between the source region 614s and the drain region 614d.

When the active region 614' is doped with the n or p type impurities, the capacitor lower electrode region 612a' in the storage area 30 is also doped with the n or p type impurities, thereby forming the capacitor lower electrode 612a. The entire capacitor lower electrode region 612a' may be doped with the n or p type impurities. Since the active region 614' and the capacitor lower electrode region 612a' are doped with the n or p type impurities together, the active layer 614 and the capacitor lower electrode 612a may be doped with the same impurities.

Figure 12:
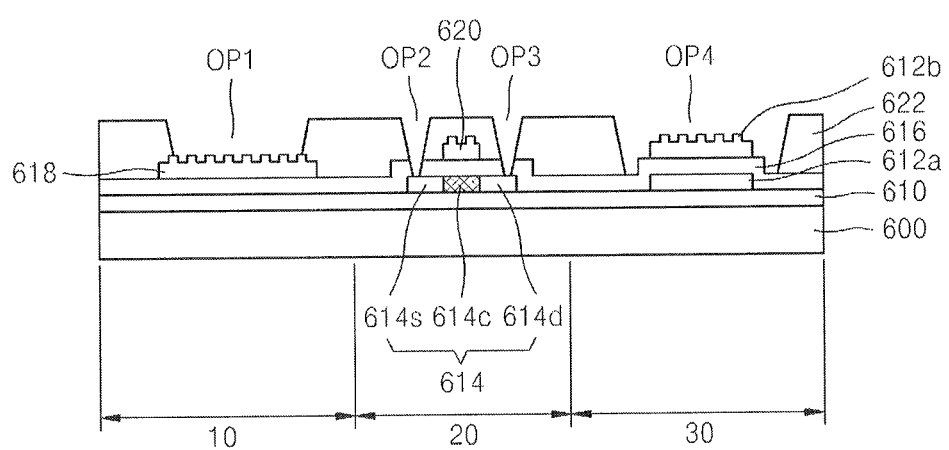

Referring to FIG. 12, after a second insulating layer 622 is deposited on the resultant structure of FIG. 11, the second insulating layer 622 may be patterned using a mask (not shown) to form openings OP1, OP2, OP3, and OP4. The second insulating layer 622 may be formed of at least one organic insulating material of polyimide, polyamide, acryl resin, benzocyclobutene, and phenolic resin, according to spin coating. Otherwise, the second insulating layer 622 may be formed of an inorganic insulating material used to form the first insulating layer 616 or may be formed by alternately depositing the organic insulating material and the inorganic insulating material. The second insulating layer 622 may be formed to an appropriate thickness to act as an interlayer insulating film between the gate electrode 620 and source and drain electrodes 624 and 626 of FIG. 12.

The first opening OP1 and the fourth opening OP4 are formed by patterning the second insulating layer 622, and the second opening OP2 and the third opening OP3 are formed by patterning both the first and second insulating films 616 and 622. The size of the first opening OP1 may be smaller than the size of the first electrode layer 618. The second opening OP2 and the third opening OP3 are contact holes via which portions of the source region 614s and the drain region 614d are exposed.

Figure 13:
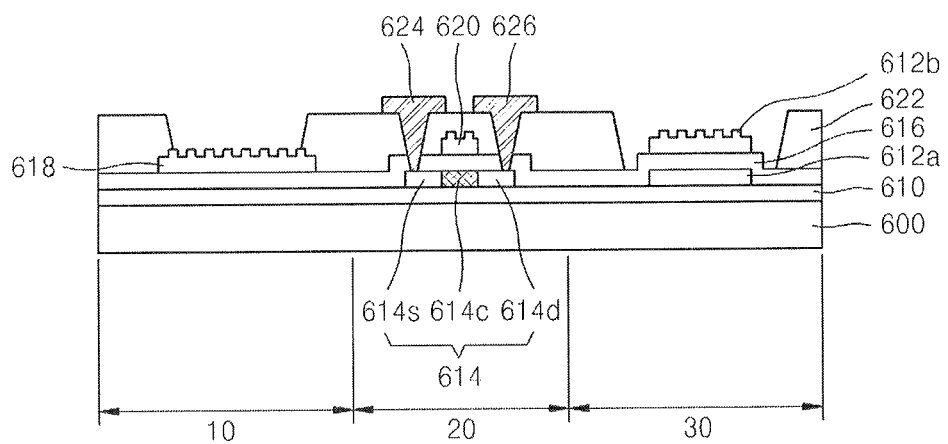

Referring to FIG. 13, a source electrode 624 and a drain electrode 626 are formed. First, a conductive film (not shown) is deposited on the entire substrate 600, and the source electrode 624 and the drain electrode 626 are formed using a masking process. The source electrode 624 and the drain electrode 626 are formed by selectively etching the conductive film according to the masking process.

Figure 14:
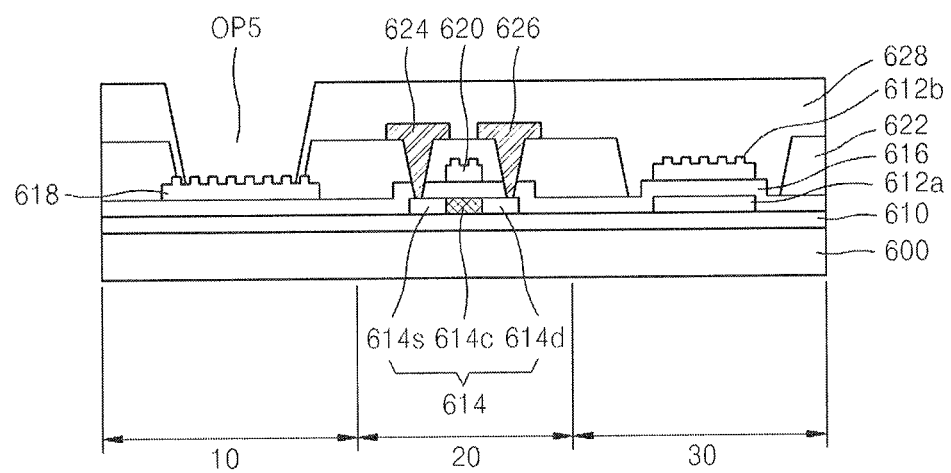

Referring to FIG. 14, a pixel defining film 628 is formed on the substrate 600. First, a third insulating layer 628 is formed on the entire resultant structure of FIG. 13. For example, the third insulating layer 628 may be formed of at least one organic insulating material, e.g., at least one of polyimide, polyamide, acryl resin, benzocyclobutene, and phenolic resin, according to spin coating. In another example, the third insulating layer 628 may be formed of an inorganic insulating material, e.g., at least one of $SiO_2$, $SiN_x$, $Al_2O_3$, $CuO_x$, $Tb_4O_7$, $Y_2O_3$, $Nb_2O_5$, and $Pr_2O_3$. In yet another example, the third insulating layer 628 may have a multi-layered structure in which the organic insulating material and the inorganic insulating material are alternately deposited.

The third insulating layer 628 may be formed to cover both sides of the capacitor Cst. In this case, when the third insulating layer 628 is formed of an organic insulating material, the third insulating layer 628 may prevent a short circuit from occurring between the capacitor lower electrode 612a and the capacitor upper electrode 612b.

Then, the third insulating layer 628 is patterned according to the masking process to form a fifth opening OP5 via which a central portion of the first electrode layer 618 is exposed, thereby defining a pixel. In this case, the size of the fifth opening OP5 may be smaller than that of the first electrode layer 618.

Figure 15:
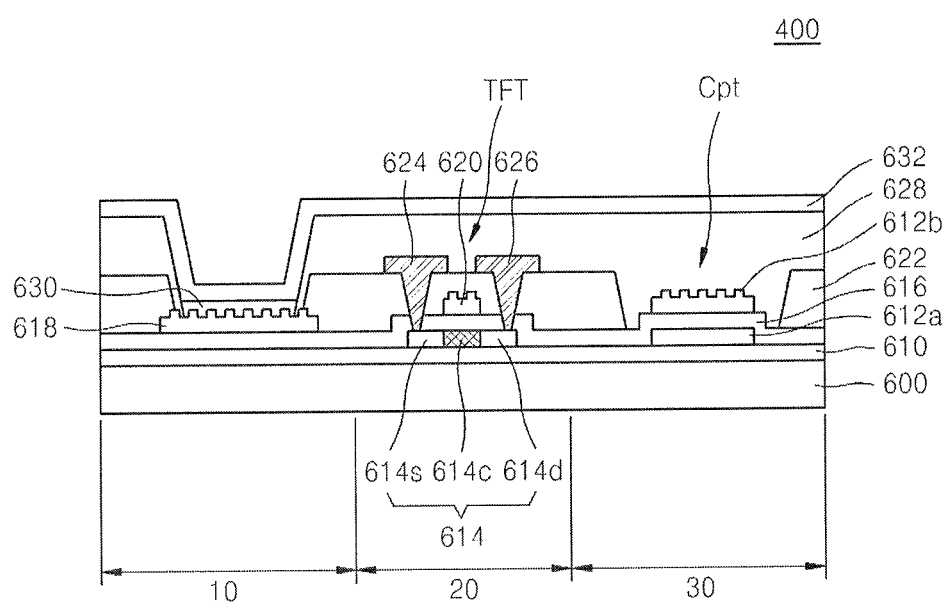

Referring to FIG. 15, an organic emission layer 630 and a second electrode layer 632 are formed in the fifth opening OP5 via which the first electrode layer 618 is exposed. The second electrode layer 632 may be formed by thinly depositing metal having a low work function, e.g., Ag, Mg, Al, Pt, Pd, Au, Ni, Nd, Ir, Cr, Li, Ca, LiF/Ca, LiF/Al, or a combination thereof.

The organic light-emitting display device according to the current embodiment is a bottom emissive type in which the first electrode layer 618 is formed in a wire grid pattern using a conductive polymer and the second electrode layer 632 is formed of metal having a low work function. However, when the organic light-emitting display device is a top emissive type, the first electrode layer 618 may be formed of metal having a low work function and the second electrode layer 632 may be formed in a wire grid pattern using a conductive polymer.

While the example embodiments have been particularly shown and described with reference to some exemplary embodiments, it will be understood by those of ordinary skill in the art that various changes in form and details may be made therein without departing from the spirit and scope of the example embodiments as defined by the following claims. For example, while the example embodiments have been described above with respect to an organic light-emitting display device, other display device, e.g., a LCD device with liquid crystals in an emission layer, may be used in implementation.

What is claimed is:

1. A thin film transistor, comprising:
a substrate;
a gate electrode on the substrate, the gate electrode including a wire grid pattern;
an active layer on the substrate;
a gate insulating film between the gate electrode and the active layer; and
a source electrode and a drain electrode connected to the active layer,
wherein the wire grid pattern of the gate electrode extends in a same direction as that of a crystal growth.

2. The thin film transistor of claim 1, wherein the gate electrode includes a conductive polymer.

3. The thin film transistor of claim 2, wherein the conductive polymer includes at least one of PEDOT-PSS, polythiophene, poly(3-alkylthiophene), polypyrrole(PPY), poly ((2,5 dialkoxy)-p-phenylene vinylene), poly(p-phenylene vinylene), and poly(p-phenylene).

4. The thin film transistor of claim 1, wherein the wire grid pattern has a critical dimension of about 10 nm to about 100 nm.

5. The thin film transistor of claim 4, wherein a width of projections in the wire grid pattern is about 10 nm to about 100 nm.

6. The thin film transistor of claim 1, wherein each of the source electrode and the drain electrode includes a wire grid pattern.

7. The thin film transistor of claim 1, wherein the active layer, the gate insulating film, and the gate electrode are stacked on the substrate in the stated order, the source and drain electrodes penetrating through the gate insulating film to connect to the active layer.

8. The thin film transistor of claim 1, wherein the gate electrode, the gate insulating film, and the active layer are stacked on the substrate in the stated order.

9. The thin film transistor of claim 8, wherein each of the source electrode and the drain electrode includes a conductive polymer shaped as a wire grid pattern.

10. The thin film transistor of claim 8, wherein the wire grid pattern includes a conductive polymer, the conductive polymer being at least one of PEDOT-PSS, polythiophene, poly (3-alkylthiophene), polypyrrole(PPY), poly((2,5 dialkoxy)-p-phenylene vinylene), poly(p-phenylene vinylene), and poly(p-phenylene).

11. An organic light-emitting display device, comprising:
a substrate;
a thin film transistor on the substrate;
a first electrode layer contacting the thin film transistor, the first electrode layer including a wire grid pattern;
an organic emission layer on the first electrode layer; and
a second electrode layer on the organic emission layer,
wherein the wire grid pattern of the first electrode layer extends in a same direction as that of a crystal growth.

12. The organic light-emitting display device of claim 11, wherein the first electrode layer includes a conductive polymer.

13. The organic light-emitting display device of claim 12, wherein the conductive polymer includes at least one material of PEDOT-PSS, polythiophene, poly(3-alkylthiophene), polypyrrole(PPY), poly((2,5 dialkoxy)-p-phenylene vinylene), poly(p-phenylene vinylene), and poly(p-phenylene).

14. The organic light-emitting display device of claim 11, wherein the second electrode layer includes metal having a low work function.

15. The organic light-emitting display device of claim 11, wherein the wire grid pattern of the first electrode layer has a critical dimension of about 10 nm to about 100 nm.

16. A thin film transistor, comprising:
a substrate;
a gate electrode on the substrate, the gate electrode including a wire grid pattern, the wire grid pattern including a plurality of alternating projections and indentations, the wire grid pattern and the gate electrode including a same material;
an active layer on the substrate;
a gate insulating film between the gate electrode and the active layer; and
a source electrode and a drain electrode directly on an upper surface of the active layer.

17. The thin film transistor of claim 16, wherein the wire grid pattern includes a plurality of projections at constant intervals.

18. The thin film transistor of claim 17, wherein a width of each projection defines a critical dimension of the wire grid pattern of about 10 nm to about 100 nm.

* * * * *